United States Patent
Hovis et al.

(10) Patent No.: US 11,105,844 B2
(45) Date of Patent: Aug. 31, 2021

(54) PREDICTIVE VOLTAGE TRANSIENT REDUCTION IN INTEGRATED CIRCUITS

(71) Applicant: Microsoft Technology Licensing, LLC, Redmond, WA (US)

(72) Inventors: William Paul Hovis, Sammamish, WA (US); Gregory M. Daly, Seattle, WA (US); Rich Tat An, Renton, WA (US); Andres Felipe Hernandez Mojica, Seattle, WA (US); Garrett Douglas Blankenburg, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 102 days.

(21) Appl. No.: 16/456,581

(22) Filed: Jun. 28, 2019

(65) Prior Publication Data
US 2020/0408832 A1 Dec. 31, 2020

(51) Int. Cl.
*G01R 31/28* (2006.01)
*G01R 31/319* (2006.01)
*G01R 31/317* (2006.01)

(52) U.S. Cl.
CPC ... *G01R 31/2851* (2013.01); *G01R 31/31924* (2013.01); *G01R 31/31721* (2013.01)

(58) Field of Classification Search
USPC ............................ 324/762.02, 102, 130, 601
See application file for complete search history.

(56) References Cited

U.S. PATENT DOCUMENTS

| | | | | |
|---|---|---|---|---|
| 5,773,990 A | * | 6/1998 | Wilstrup | G01R 31/3004 324/762.02 |
| 2002/0125904 A1 | * | 9/2002 | Eldridge | G01R 31/31721 324/754.03 |
| 2002/0186037 A1 | * | 12/2002 | Eldridge | G01R 31/31924 324/754.07 |
| 2008/0157745 A1 | | 7/2008 | Nakata | |
| 2009/0063884 A1 | | 3/2009 | Weekly | |
| 2011/0074497 A1 | * | 3/2011 | Kojima | G01R 31/31924 327/540 |
| 2013/0151877 A1 | * | 6/2013 | Kadri | G06F 1/3296 713/320 |
| 2014/0327466 A1 | * | 11/2014 | Huang | G01R 31/2827 324/764.01 |
| 2015/0303912 A1 | | 10/2015 | Coutts et al. | |
| 2015/0364994 A1 | | 12/2015 | Dosluoglu et al. | |
| 2016/0132084 A1 | | 5/2016 | Solki et al. | |
| 2019/0034203 A1 | | 1/2019 | Ardanaz et al. | |

OTHER PUBLICATIONS

"International Search Report and Written Opinion Issued in PCT Application No. PCT/US20/032541", dated Jul. 22, 2020, 13 Pages.

* cited by examiner

*Primary Examiner* — Tung X Nguyen
*Assistant Examiner* — Robert P Alejnikov, Jr.

(57) ABSTRACT

Power control arrangements for integrated circuit devices are discussed herein. In one example, an assembly includes an integrated circuit device comprising one or more processing cores and a power domain configured to distribute a supply voltage to the one or more processing cores. The assembly also includes a charge injection circuit coupled to the power domain of the integrated circuit device, and configured to selectively couple electric charge into the power domain to predictively offset at least portions of voltage transients in the power domain.

20 Claims, 6 Drawing Sheets

PREDICTIVE VOLTAGE TRANSIENT REDUCTION IN INTEGRATED CIRCUITS

BACKGROUND

Integrated circuit devices, such as central processor devices, graphics processors, or system-on-a-chip (SoC) devices can be employed in computing systems. These integrated circuit devices can have one or more voltage domains which correspond to particular power distribution subdivisions within the integrated circuit device. In large integrated circuit devices, operating frequencies and operating temperatures are significant design concerns. However, a major barrier to increasing integrated circuit operating frequency is transient response and stability of the voltage domains supplying various processing units that form the integrated circuit device. These processing units, among other on-die components, can have power demands that vary rapidly and across a large power consumption range. As these power demands change quickly over time, voltage levels can experience dips or spikes, potentially leading to operational failures of at least the processing units.

To counter these variations in power demands, many systems include decoupling capacitors or increase operating voltages. However, increased voltage levels can lead to increased power consumption and operating temperatures. Decoupling capacitors can be employed to reduce some transient effects related to these power demands. Unfortunately, placement of decoupling capacitors on nearby circuit boards can lead to other sets of problems, and is limited in effectiveness because such placement is relatively far away in electrical terms to target circuitry. For example, inductance from interconnect and positioning between the decoupling capacitors and the target circuitry limits the effectiveness of the decoupling capacitors.

Overview

Power control arrangements for integrated circuit devices are discussed herein. In one example, an assembly includes an integrated circuit device comprising one or more processing cores and a power domain configured to distribute a supply voltage to the one or more processing cores. The assembly also includes a charge injection circuit coupled to the power domain of the integrated circuit device, and configured to selectively couple electric charge into the power domain to predictively offset at least portions of voltage transients in the power domain.

In another example, a method includes monitoring pending operations for one or more processing cores of an integrated circuit device. Based at least on the pending operations, the method includes predicting voltage transients on a voltage domain that distributes a supply voltage to the one or more processing cores, and selectively injecting a boost voltage into the power domain to offset at least portions of the voltage transients in the power domain resultant from operation of the one or more processing cores.

In another example, a circuit includes one or more capacitive elements and a control system. The control system is configured to charge the one or more capacitive elements to a boost voltage higher than a supply voltage of a power domain that distributes the supply voltage to one or more processing cores of an integrated circuit device. The control system is configured to receive indications of at least pending operations within command queues of the one or more processing cores, process the pending operations to predict one or more voltage droops in the power domain of the integrated circuit device, and inject the boost voltage into the power domain to at least partially offset the one or more voltage droops.

This Overview is provided to introduce a selection of concepts in a simplified form that are further described below in the Detailed Description. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1:
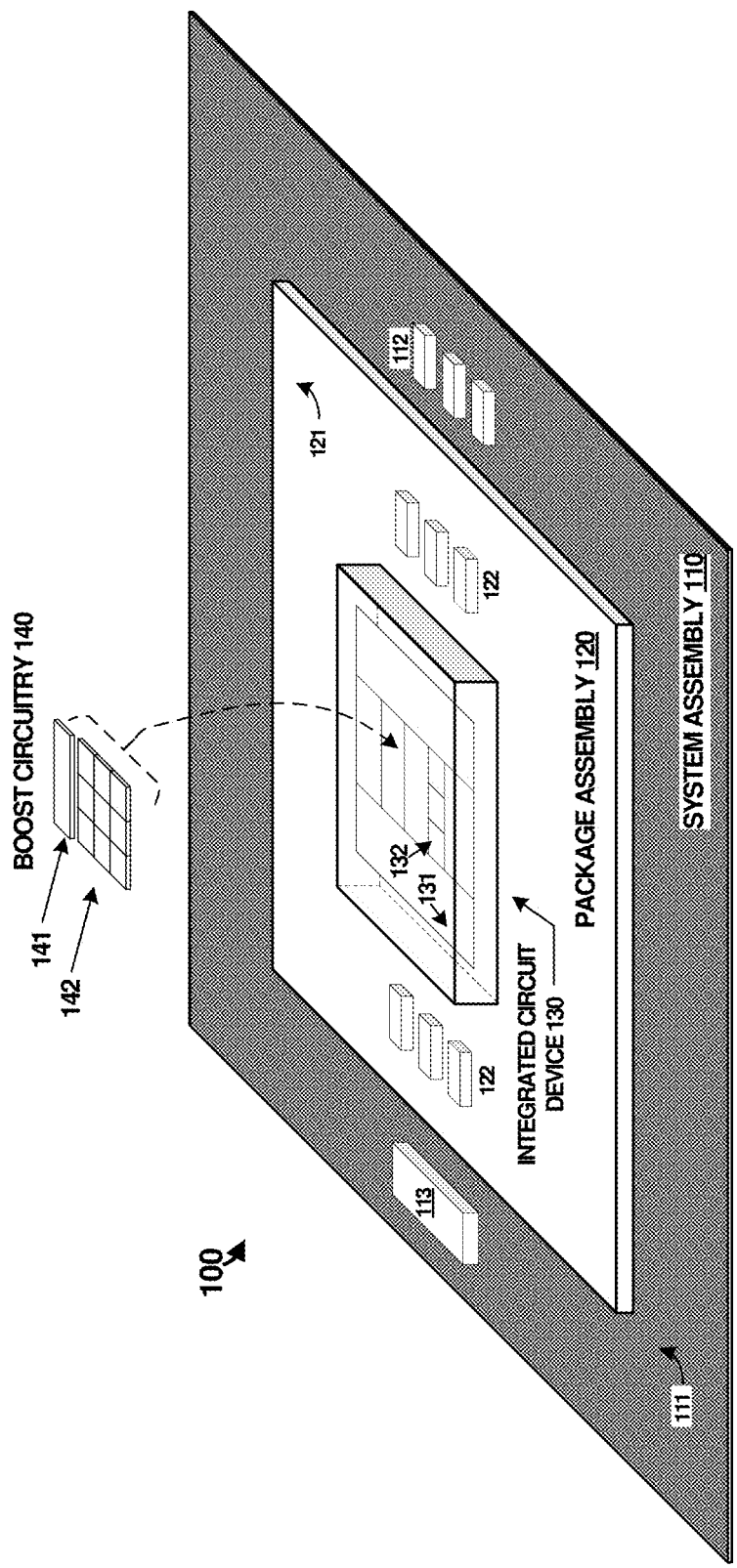
FIG. 1 illustrates an assembly in an implementation.

In large-scale integrated circuit devices, such as system-on-a-chip (SoC) and computer processor designs, transient response and stability of voltages across distribution elements supplying power to execution units can be a concern. As execution units operate, current draw can vary significantly and can change rapidly over short timeframes. This can be due to the particular set of instructions, commands, or operations that the execution units are presently handling, as well as in operational variations from execution unit to execution unit. Rapid changes in current draw can lead to voltage transients manifested on voltage distribution structures as voltage dips or droops, although voltage spikes may also be possible due to rapid load shedding in certain situations. The examples herein advantageously decrease the influence of high frequency voltage transient events, such as dips or droops, among other transient events which occur on voltage distribution structures of integrated circuit devices.

Decoupling capacitors are employed in many integrated circuit designs to attempt to reduce the effect of voltage transient events. Decoupling capacitors can be positioned on a circuit board outside of an integrated circuit device, or included as on-die capacitors that accompanies logic circuitry. However, both of these capacitor placement types can still fail to prevent on-die voltage transients due to relative distances between the capacitors and processing cores as well as limitations on charge delivery timescales. Both techniques also rely on a responsive or reactive approach to supplying charge during fast voltage transients. For circuit board positioning of capacitance, this positioning can still leave relatively long distances between the decoupling capacitors and the target circuitry, which can have associated inductance and further exasperate the negative influences of transient events. Circuit board or perimeter decoupling capacitors are typically too far away from an affected circuit and have too much inductance to relieve very fast transients on integrated circuit devices. Another solution is to integrate capacitance into the same die as the integrated circuit device itself. Since capacitance is directly related to unit area, any addition of capacitive structures on the die results in usage of more die area. Thus, this technique is typically an expensive venture leading to larger dies and increasing costs. Also, on-die decoupling capacitors take up valuable circuit real estate, complicate fabrication, and can unintentionally space apart processing units or other functional elements leading to logic routing and placement complications. High-performance processors are often built using the latest fabrication technology and smallest feature sizes, and thus are the most expensive to manufacture, so any increase in die area for capacitance also increases the total integrated circuit cost dramatically. Adding capacitance structures to make the die larger also can create challenges for semiconductor designers, since capacitance structures can displace functional logic or processing cores, and affected signals must travel farther. This can lead to difficultly in placement and routing, as well as establishing proper timing relationships among logic/cores.

In the examples herein, several example implementations of enhanced voltage boost arrangements are discussed. These voltage boost arrangements comprise an energy stored unit, such as an array of capacitors, along with a predictive control unit. The capacitors are typically charged to a voltage higher than a supply voltage of target circuitry. The control unit can monitor at least upcoming operations of the target circuitry and predict or estimate when voltage transients might occur. The control unit can then quickly couple the capacitors to the voltage domain which provide a boost of charge or voltage to the voltage domain and can counteract or offset at least a portion of the forecasted voltage droop/dip, which might comprise even a greater amount than the forecasted voltage droop. Thus, in contrast to passive capacitance which can merely react to voltage transients, the examples herein actively predict and offset expected voltage transients.

In addition to better transient response for voltage domains of integrated circuit devices, the examples herein can lead to overall reduced operating voltages for the integrated circuit devices. Since voltage transients will be advantageously reduced on average, then an operating voltage can be of a lower level than typically possible without the boost circuitry discussed herein. This is due to a reduced need for main power supply circuitry to compensate for the deviations in operating voltages due to the voltage transients. The boost circuitry discussed herein can predictively provide energy on-demand to counteract fast voltage droops, and thus normalize the associated voltage levels of a voltage domain. To determine these lower operating voltages, in situ performance testing can be run which exercises the various processing cores and affected circuitry while the boost circuitry is operating. Lower operating voltages and operating powers can also lead to reduced operating temperatures for the integrated circuit device, or allow for faster operating frequencies for a given power level. Suitable on-board or on-die decoupling capacitance can also be included for further voltage transient reduction for slower or longer voltage transients.

Turning now to a first example implementation, FIG. 1 is presented. FIG. 1 illustrates an integrated circuit arrangement 100 in an implementation. System assembly includes circuit board 111, decoupling capacitors 112, and power supply circuitry 113. System circuit board 111 of system assembly 110 is conductively coupled to package assembly 120. Package assembly comprises carrier circuit board 121 for integrated circuit device 130 as well as decoupling capacitors 122. Integrated circuit device 130 includes internal integrated elements 131-132. Elements 131-132 can comprise various processing cores, graphics cores, interfacing circuitry, interconnect, and other elements of an integrated circuit device. In some examples, elements 132 comprise on-die capacitance elements for logic and circuitry that comprise elements 132.

FIG. 1 also shows boost circuitry 140 comprising control unit 141 and capacitance elements 142. Boost circuitry 140 can be included on the same die as integrated circuit device 130 in some examples. Boost circuitry 140 might instead be included on a separate semiconductor die than integrated circuit device 130 and mounted in a stacked fashion to the 'top' of the semiconductor die of integrated circuit device 130. When in the stacked configuration, conductive pads formed on surface of a semiconductor die of boost circuitry 140 can be conductively coupled to integrated circuit device 130 over one or more through-silicon vias (TSVs) manufactured into integrated circuit device 130. An advantage of the stacked configuration is that an output of boost circuitry 140 can be coupled very closely to the affected circuitry of integrated circuit device 130 through a vertical connection. This can avoid complex placement and routing to locate boost circuitry 140 on the same semiconductor die as integrated circuit device 140. However, the enhanced circuitry and techniques discussed herein apply to both on-die and separate die arrangements, and combinations where boost capacitance is located separately from control circuitry.

In typical configurations, integrated circuit device 130 comprises various integrated elements 131-132, such as processing cores, interfacing logic, power distribution structures, and the like. Integrated circuit device 130 is bonded or otherwise coupled to carrier circuit board 121 of package assembly 120. Together, package assembly with integrated circuit device 130 might comprise a system-on-a-chip (SoC), central processing unit (CPU), or graphics processing unit (GPU), among other packaged devices. This packaged device can be coupled to a system board, such as a motherboard, comprising system circuit board 111 for integration into a computing system. Various support circuitry (not shown for clarity), such as memory, storage, peripherals, power supplies, and other related circuitry, can be included on such a system board, also referred to as a motherboard. System assembly 110 can comprise this system board, as well as other components.

Various perimeter decoupling capacitors can also be placed onto system assembly 110 and package assembly 120, such as around perimeters of integrated circuit device 130 and package assembly 120. In FIG. 1, a first set of decoupling capacitors 112 are positioned onto system circuit board 111. A second set of decoupling capacitors 122 are positioned onto package assembly 120. Decoupling capacitors 112 and 122 can reduce voltage fluctuations due to transient effects of integrated circuit device 130, as well as reduce susceptibility and emissions with regard to electromagnetic interference. However, due to the distances between decoupling capacitors 112 and 122 and relevant portions of integrated circuit device 130, relatively large current loops can be formed, which has corresponding inductance on the affected voltage links of included power domains. These inductances, among other factors, can place limits on transient speeds or maximum frequencies over which decoupling features are effective. When these decoupling features are not sufficient to reduce transients on voltage links, such as droops, dips, and spikes, among other transient events, then operation of integrated circuit device 130 can be reduced. Failures can even result during larger transient events and dynamic changes in power demands of integrated circuit device 130.

One potential way to compensate for voltage dips and droops is to increase a level of a voltage supplied the various power domains of integrated circuit device 130. For example, if a particular voltage domain specifies 1.00 VDC, then an increase to 1.05 VDC or 1.10 VDC might aid tolerance of integrated circuit device 130 to various voltage dips. However, this not only can waste energy, but lead to higher power dissipation within integrated circuit device 130, and thus increased heating. In FIG. 1, instead of increasing a supply voltage level, or altering a quantity or arrangement of capacitors around a perimeter of integrated circuit device 130 or package assembly 120, an enhanced arrangement is shown.

Specifically, FIG. 1 boost circuitry 140 is included to provide predictive injections of charge into various power distribution structures of integrated circuit device 130. This charge can be supplied from an array of capacitors or capacitance elements 142 and controlled by control circuitry 141. A more detailed discussion on the elements and operation of boost circuitry 140 is found below.

Assemblies formed with boost circuitry 140 and integrated circuit device 130 can improve a minimum voltage (Vmin) needed to supply integrated circuit device 130 by a significant amount which translates into improvements in device power efficiency. If desired, these efficiency gains in Vmin operation can be translated into supplying a lower voltage level to the affected circuit, which can reduce power dissipation for a particular operating frequency. In addition, an increased operating frequency can be supported for a selected power level by lowering voltages supplied to integrated circuit device 130 as operating frequency is increased. In some examples, the voltage reduction resultant from a new Vmin can be used entirely for power savings without performance improvement for processing cores of integrated circuit device 130. Alternatively, some (or all) of the Vmin improvement can instead be used for performance improvement with increased operating frequencies for processing cores. Combinations of voltage reductions for power savings and increases in performance by operating frequency increases are also possible. In addition to operating voltage reductions, power savings, and more stable operation of the target circuitry, further advantages are gained when the enhanced boost circuitry discussed herein is employed. For example, the reduction or elimination of transient voltage events can lead to a reduction in noise emissions (both radiative and conductive emissions) from a target integrated circuit.

Turning now to a detailed discussion on the elements of FIG. 1, system assembly 110 comprises one or more printed circuit boards (PCBs) or circuit card assemblies (CCAs) formed using various circuit board manufacturing processes. System assembly 110 can comprise a computing system motherboard or daughterboard in many examples. System assembly 110 can include circuit boards as well as components mounted to the circuit boards. In FIG. 1, system assembly 110 includes exemplary system circuit board 111, although other configurations are possible. System circuit board 111 can comprise fiber-infused dielectric materials, such as fiberglass, FR4, or various composite materials. System circuit board 111 comprises two surfaces or sides as well as several layers of alternating insulating board material and conductive interconnect or traces formed with metal etchings or printed conductive features. System circuit board 111 can include one or more power distribution layers/planes or grounding layers/planes which form one or more layers of the associated circuit board. System circuit board 111 can include conductive vias which can penetrate an entire layered stackup of system circuit board 111 or a subset of layers, which may or may not include hidden or buried vias. System circuit board 111 can include labeling/screen printing, solder mask material, and chassis mounting features.

Decoupling capacitors 112 can be included on system circuit board 111 within system assembly 110. Capacitors 112 can comprise surface mount, multilayer ceramic capacitors (MLCCs), through-hole, or other types of discrete capacitors. Similarly, capacitors 122 can comprise similar types of capacitors as capacitors 112. Capacitors 112 and 122 can be of various sizes, such as 0201, 0402, or 0603 size surface mount capacitors, among others.

Power supply circuitry 113 comprises various power conditioning, filtering, and handling components which accept input power for a system comprising elements in FIG. 1. In one example, power supply circuitry 113 comprises a plurality of power phases each comprising voltage conversion circuitry to step down or step up source power to various supply voltages or input voltages provided to integrated circuit device 130, among other components on system assembly 110. These power phases can each have an associated controlled voltage level, which might be variable or adjustable depending upon conditions, performance testing, minimum necessary voltages, or other factors. The power phases can provide power to integrated circuit device 130 over dedicated circuit links comprising circuit traces, circuit board vias, and power planes which route the power from circuitry represented by power supply circuitry 113 over system circuit board 111 and other elements including package assembly 120.

Package assembly 120 comprises an integrated circuit package which includes a carrier comprising a printed circuit board, typically smaller than that of system assembly 110. Package assembly 120 can comprise similar materials as system assembly 110, such as layers of insulating and conductive materials with associated traces, planes, routing, vias, and the like. Package assembly 120 couples to system assembly 110 via one or more solder bumps or solder features, such as controlled collapse chip connections (C4). Typically, pins and sockets are not employed for package assembly 120, but in some examples are possible. Package assembly 120 can comprise a flip-chip assembly when fitted with an associated die of an integrated circuit, such as integrated circuit device 130. Package assembly 120 has a first surface or side (referred to as a die side) which couples to integrated circuit device 130 and a second surface or side (referred to as a land side) which couples to a system assembly PCB via solder features, such as conductive pads and solder balls.

Integrated circuit device 130 comprises a microprocessor, central processing unit (CPU), graphics processing unit (GPU), system-on-a-chip (SoC), application-specific integrated circuit (ASIC), field-programmable gate array (FPGA) tensor processing unit (TPU), or baseband processing unit (BBU), among other analog and digital integrated circuits. Integrated circuit device 130 can comprise various processing cores, graphics processing cores, digital signal processing (DSP) cores, application-specific integrated circuit (ASIC) cores, tensor processing cores, and artificial intelligence processing cores. Integrated circuit device 130 is formed using various semiconductor manufacturing processes, such as employed in semiconductor wafer fabrication. Integrated circuit device 130 can comprise silicon-based circuit, but might also include other types of semiconductor materials as well as associated conductive interconnect. Integrated circuit device 130 includes various layers, logic devices, interconnect, metallization, processing cores, and interfacing circuitry. Integrated circuit device 130 comprises one or more power domains, each having a characteristic voltage level. Integrated circuit device 130 can comprise a flip-chip design which has external pads on a top side of chip (with regard to a manufacturing directionality), and is coupled to carrier circuit board 121 of package assembly 120 via solder features/balls, controlled collapse chip connections (C4) or other conductive bonding processes.

Boost circuitry 140 includes control circuitry 141 and capacitors 142. Control circuitry 141 can comprise one or more microprocessors and other processing circuitry. Control circuitry 141 can retrieve and execute software or firmware to operate as described herein. Control circuitry 141 can be implemented within a single processing device but can also be distributed across multiple processing devices or sub-systems that cooperate in executing program instructions. Examples of control circuitry 141 include general purpose central processing units, application specific processors, and logic devices, as well as any other type of processing device, combinations, or variations thereof. In some examples, control circuitry 141 comprises a processing core, a hardware security module (HSM), hardware security processor (HSP), security processor (SP), trusted zone processor, trusted platform module processor, management engine processor, microcontroller, microprocessor, FPGA, ASIC, application specific processor, or other processing elements.

Capacitors 142 can comprise surface mount, multilayer ceramic capacitors (MLCCs), or other types of discrete capacitors or various materials, including semiconductor capacitors. Capacitors 142 can be of various sizes, such as 0201 or 0204 sizes, or of larger sizes such as 0603 or 0402 size surface mount capacitors, among others. In an alternative example, instead of discrete or individual capacitors, capacitors 142 might comprise an integrated capacitance element having an array of individual capacitors integrated into a silicon or semiconductor die. This semiconductor capacitor array might comprise an integrated array of metal-oxide-semiconductor or metal-insulator-semiconductor capacitance elements.

Figure 2:
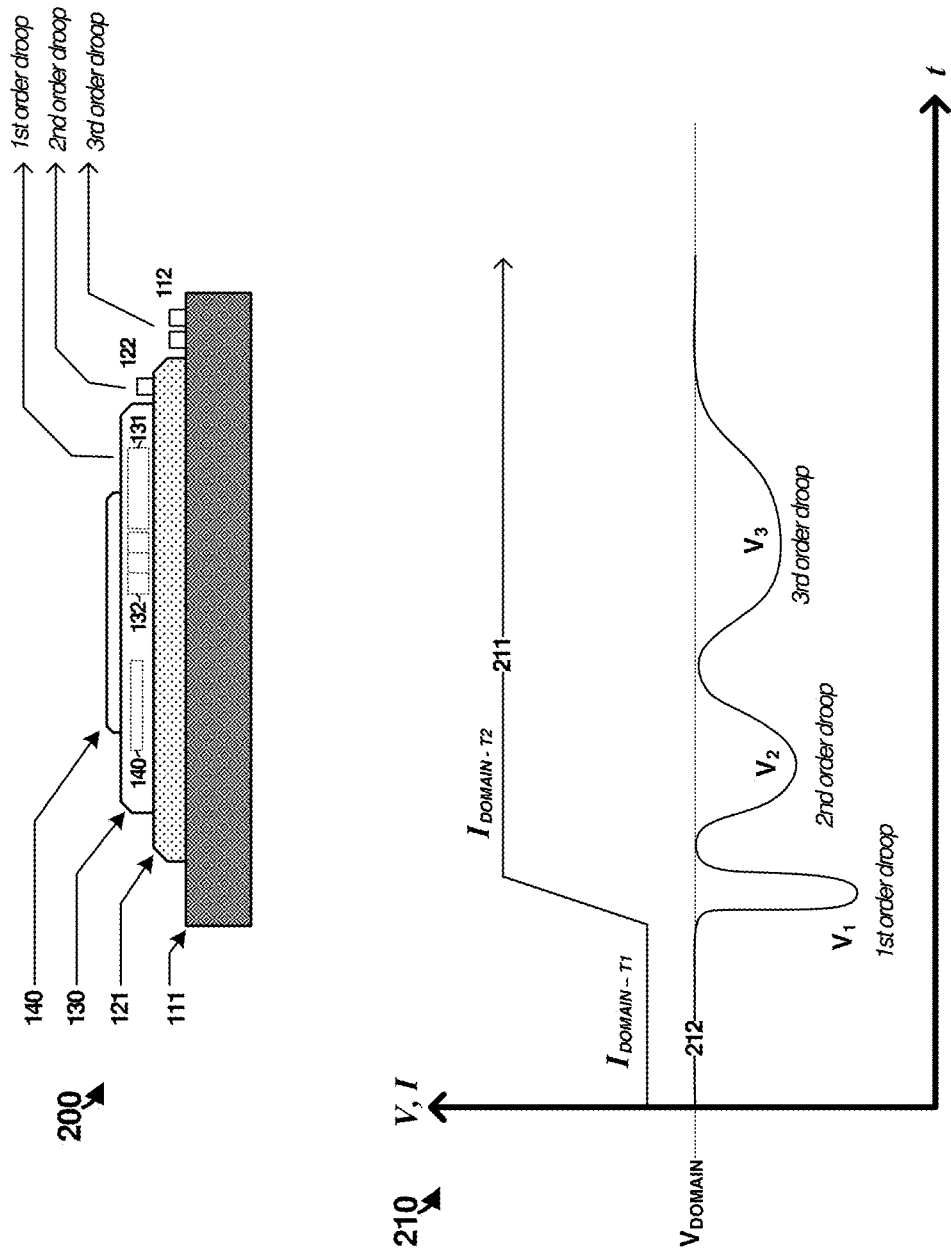
FIG. 2 illustrates example power domain transients in an implementation.

Turning now to a brief discussion on the various transient effects which can be experienced by an integrated circuit device, FIG. 2 is presented. FIG. 2 illustrates assembly 200 in an implementation. Although similar elements as found in FIG. 1 are shown in FIG. 2, it should be understood that other elements can instead be included. Also, many elements in FIG. 2 are not drawn to scale, and instead are sized to enhance clarity in the associated discussion.

Assembly 200 illustrates an example stackup among system assembly 110, package assembly 120, integrated circuit device 130, and boost circuitry 140. System assembly 110 is shown having system circuit board 111 with one or more perimeter decoupling capacitors 112. Further circuitry can be included in system assembly 110, such as memory, storage, peripherals, power distribution circuitry, and other similar elements. These are not shown in FIG. 2 for clarity. Integrated circuit device 130 comprises a semiconductor die which is bonded to carrier circuit board 121 of package assembly 120. This configuration might comprise a flip-chip configuration, although other configurations are possible. Solder balls or solder bumps can couple integrated circuit device 130 to carrier circuit board 121 to form package assembly 120, along with other circuitry which might include perimeter decoupling capacitors 122. Package assembly 120 is also coupled using solder balls or solder bumps to system circuit board 111.

In assembly 200, boost circuitry 140 can comprise a separate die bonded via solder balls onto a die of integrated circuit device 130, or boost circuitry 140 can instead be incorporated into the same die as integrated circuit device 130. Both arrangements are shown in FIG. 2, although typically only one arrangement will be employed. Combinations of on-die and off-die arrangements might be employed, such as where capacitance elements are located in one arrangement and control circuitry is in another.

Various areas of integrated circuit device 130 that can benefit from having nearby capacitance of boost circuitry 140, due in part to having dynamic operation with high power demand and susceptibility to voltage transients. Example areas of integrated circuit device 130 include processing cores, graphics cores, input/output cores, memory bus cores, and other similar elements. Some areas of the device may be somewhat immune from such concerns, due to either low power demands overall or having consistent power demand that varies little and thus corresponds to low transients. Placement of capacitance elements of boost circuitry 140 on a top surface of integrated circuit device 130 or below integrated circuit device 130 can allow fine-grained placement of the capacitance elements with regard to target circuitry of integrated circuit device 130. TSV elements might be employed to electrically couple top-sided capacitance elements to target circuitry of integrated circuit device 130. In alternative arrangements, capacitance elements of boost circuitry 140 can be included in the same semiconductor die as integrated circuit device 130. Placement within the die can vary and may be selected based on proximity to target circuitry or proximity to power distribution elements.

An assembly having package assembly 120 and boost circuitry 140 would provide substantially improved power supply stability for integrated circuit device 130 that allows for improved performance and/or reduced power supply voltages due to decreased power supply transients. This can also lead to improved circuit operating voltage minimum (Vmin) values by having less dynamic variation in voltage levels provided to the individual power domains. Voltage optimization techniques might be executed to determine reduced input voltages for integrated circuit device 130 which are lower than manufacturer specified minimums. These voltage optimization techniques benefit from boost circuitry 140. Specifically, a reduced magnitude of transient effects on voltage domains from predictive injection of charge by boost circuitry 140 can correspond to reduced voltage levels needed to be supplied to a given circuit, and thus less average power consumption by the circuit.

FIG. 2 also includes graph 210. Graph 210 illustrates transient response behavior of elements of assembly 200 during operation of integrated circuit device 130. For purposes of illustration, graph 210 shows a series of voltage droops as example voltage transients. Also, for clarity, the enhanced operation provided by boost circuitry 140 is omitted in graph 210. Examples of the enhanced operation of boost circuitry 140 are included in FIG. 4.

In graph 210, a current supplied to a voltage domain of integrated circuit device 130 is shown in the top plot 211. This voltage domain might be any voltage domain supplying power to a processing core, graphics core, or other subdivision of integrated circuit device 130. Plot 211 illustrates an initial current for the voltage domain ($I_{DOMAIN-T1}$) followed by a rapid increase in current draw for the voltage domain to a resultant current ($I_{DOMAIN-T2}$). This resultant current level may persist for a period of time before changing. Coincident with the current increase in plot 211, transient response of a voltage of the voltage domain is shown in plot 212. Three droops are shown in plot 212, each corresponding to a different 'order' of droop. Each droop has a corresponding minimum voltage level, indicated by V1 for the first order droop, V2 for the second order droop, and V3 for the third order droop.

The origin of the three droops can arise from different sets of decoupling capacitance for integrated circuit device 130. A first set of capacitance might be on-die response to the current increase, such as from on-die capacitance or inherent capacitance from voltage distribution elements. A second set of capacitance can be from on-package capacitance, such as capacitors 122 on package assembly 120. A third set of capacitance can be from on-board capacitance, such as capacitors 112 on system board 111. Each set of capacitance can only supply a portion of the charge needed to fulfill the current requirements from the transition to $I_{DOMAIN-T2}$. Thus, a first quantity of charge is provided by on-die capacitance, a second quantity of charge is provided by on-package capacitance, and a third quantity of charge is provided by on-board capacitance. Limitations in delivery speed and distance, along with inherent inductance, can limit how fast and how much charge can be delivered into the power domain. Thus, the three droops of plot 212 are experienced by integrated circuit device 130. These droops might lead to malfunction, bit errors, logic reset, or other issues for integrated circuit device 130. In order to counter these voltage droops, a steady state voltage level of the voltage domain might be increased so that the voltage minimums of the droops never exceeds a voltage minimum for the associated circuitry. However, this steady state increase in supply voltage can lead to increased power consumption and resultant heat within integrated circuit device 130, as well as potentially lower operating frequencies to compensate for too high of operating temperatures.

Figure 3:
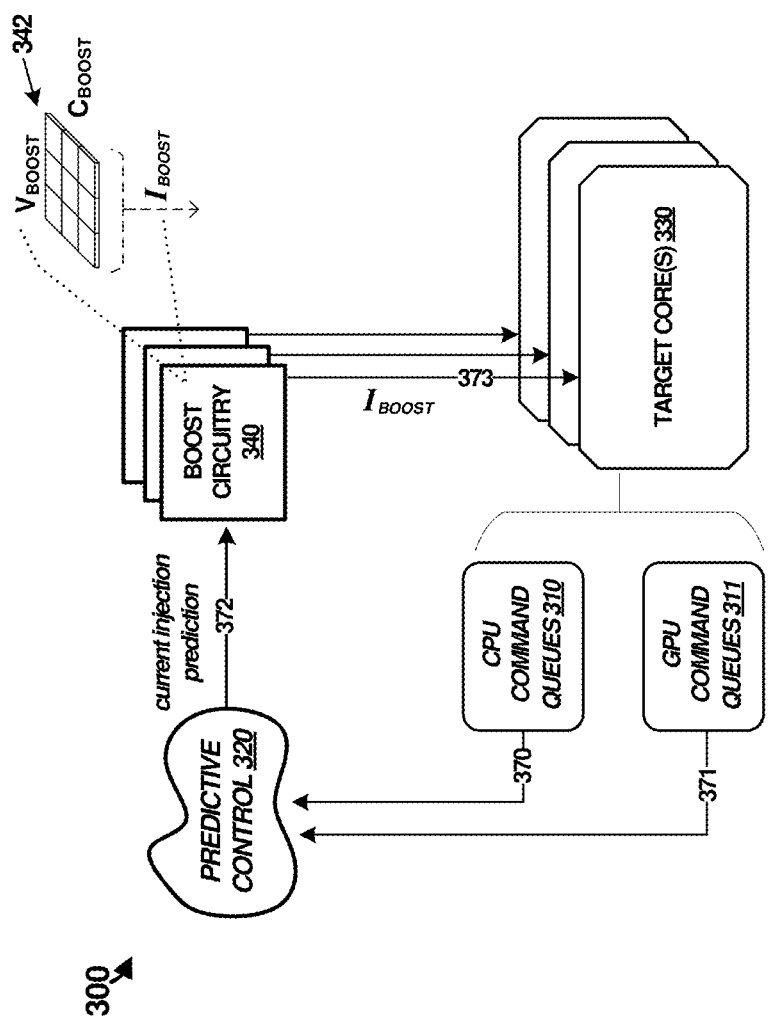
FIG. 3 illustrates a computing system in an implementation.

FIG. 3 is presented to illustrate an enhanced circuit arrangement which can predictively counteract at least a portion of the voltage droops seen in FIG. 2. In FIG. 3, system 300 is shown. System 300 includes target cores 330 which reside in an integrated circuit device, such as seen for integrated circuit device 130 of FIG. 1. Boost circuitry 340 is included addition to power supply circuitry 350. Power supply circuitry 350 can supply a steady-state supply voltage to target cores 330. However, boost circuitry 340 is provided for enhanced operation of target cores 330. To control the operation of boost circuitry 340, various control elements are shown, namely predictive control logic 320 which is fed by one or more command queues associated with target cores 330. Predictive control logic 320 issues control instructions to boost circuitry 340 over link 372. These control instructions can comprise current injection predictions. These command queues might include CPU command queues 310 and GPU command queues 311 which communicate with predictive control logic 320 over links 370 and 371, respectively.

Boost circuitry 340 includes boost capacitance ($C_{BOOST}$) 341 provided by one or more capacitors. Boost capacitance 341 is charged to boost voltage ($V_{BOOST}$) and is able to provide boost current ($I_{BOOST}$) on-demand to target cores 330 over associated voltage distribution elements of one or more voltage domains. Typically, $V_{BOOST}$ is of a higher voltage level than that normally supplied to the target circuitry. For example, if target cores 330 receive a supply voltage of 1.00 VDC, then $V_{BOOST}$ might be 1.50 VDC or other voltage. To charge the boost capacitance to $V_{BOOST}$, a separate voltage regulation circuit might be employed. This separate voltage regulation circuit can be included in boost circuitry 340. A voltage input to the voltage regulation circuit may be from similar sources or supply links as target cores 330, such as when boost conversion circuitry is included in boost circuitry 340. In other examples, separate voltage inputs can be included which supply $V_{BOOST}$ to boost circuitry 340. When triggered by predictive control 320, boost circuitry 340 can electrically switch in boost capacitance to the voltage domain of the target circuitry (e.g. target cores 330) which then applies $V_{BOOST}$ and $I_{BOOST}$ to the target circuitry over power distribution links 373. Since the predictions can coincide with actual voltage droops, then a cancelation or suppression of the voltage droops can occur. Specifically, a droop of level $V_{DROOP}$ can be counteracted, at least in part, by application of $V_{BOOST}$ at the predicted time. In this manner, at least the first order droop seen in FIG. 2 can be reduced or eliminated. Moreover, even if a prediction is incorrect, such as by overshooting an offset of the voltage of $V_{DROOP}$, the application of $V_{BOOST}$ typically does not negatively impact operation or function of the target circuitry, as long as the voltage level of $V_{BOOST}$ does not exceed maximum limits for the target circuitry.

Predictive control logic 320 included in various processing and control circuitry configured to receive telemetry related to target cores 330. From this telemetry, predictive control logic 320 can determine properties of potential voltage transients on one or more voltage domains associated with target cores 330. The properties of the potential voltage transients can then be employed to determine timings for injection of charge stored in boost capacitance 342. The telemetry related to target cores 330 can include pending commands or queued operations or other upcoming operations for target cores 330. Predictive control logic 320 makes predictions for voltage transients that correspond to estimations of increased current draw among target cores 330 based at least in part on monitoring the upcoming operations in one or more command queues of target cores 330. Workload estimations can be made using this telemetry based on similar telemetry.

In FIG. 3, several example command queues are shown for target cores 330. A first type of command queue, namely CPU command queues 310 can hold commands or operations for processing cores among target cores 330. A second type of command queue, namely GPU command queues 311 can hold commands or operations for graphics cores among target cores 330. These command queues can be monitored over links 370-371, which might comprise application programming interfaces, telemetry reporting links, along with one or more physical connections that carry indications of upcoming operations in the associated queues. Other types of queues or operational scheduling logic can be employed to provide telemetry to predictive control logic 320. These can include monitoring operating system elements or hypervisor elements to determine when new applications will be executed or halted. Additional examples of telemetric can include monitoring process or status of applications or games executed by target cores 330. Certain points or moments within applications or games might correspond to increased loading on target cores 330 or increased current draw by target cores 330. Predictive logic can be included in software or hardware to determine when voltage transient might occur in the future based on this various telemetry.

From the predictions, predictive control logic 320 can then determine when to inject charge, how much charge to inject, how long to inject charge, and which voltage domains receive a charge injection. These charge injections are provided by switching in $C_{BOOST}$ to provide $I_{BOOST}$ which counteracts predicted voltage droops in real-time. Thus, predictive control logic 320 can establish at least partial timewise overlap between injections of the electric charge into the power domain and the voltage transients. To establish at least partial timewise overlap, predictive control logic 320 controls the injections of the electric charge based at least in part on workload estimations among target cores 330 as discussed above. Advantageously, voltage transients—such as voltage droops—can be reduced or eliminated using predictive control logic 320 and selective application of charge provided by $C_{BOOST}$. This can lead to less variation in voltage levels of voltage domains associated with target cores 330, among other advantages.

Figure 4:
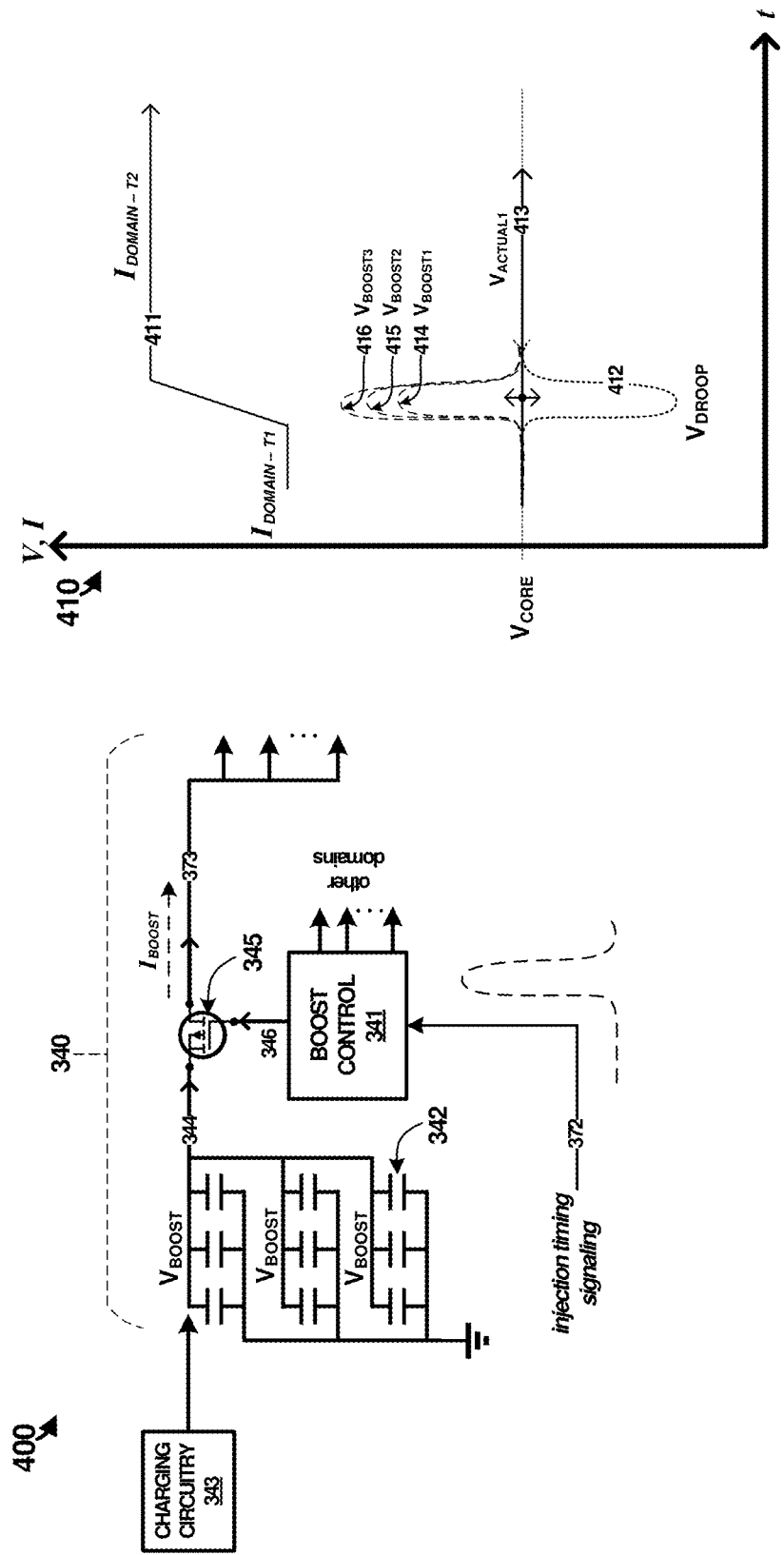
FIG. 4 illustrates a control system in an implementation.

FIG. 4 is provided to further illustrate operations and elements found in FIG. 3. System 400 of FIG. 4 includes a detailed view of boost circuitry 340 as well as an example graph 410 which shows how $V_{BOOST}$ might offset a voltage droop shown by $V_{DROOP}$.

Turning first to the detailed view of boost circuitry 340, boost capacitors 342 are shown coupled between a boost voltage ($V_{BOOST}$) and a reference potential or ground. Boost capacitors 342 can be charged by a boost charging circuit, namely charging circuitry 343. Charging circuitry 343 might include voltage conversion circuitry, voltage regulators, or other circuitry to produce a voltage higher than that of a particular voltage domain associated with target cores 330. The level of the boost voltage can vary according to implementation or during operation, which might be selectable or proportional depending on the current level of voltage applied to target cores 330. A boost voltage is thus present on electrical node 344 which is isolated from a voltage domain 373 by a selector element illustrated by switching element 345. Switching element 345 in this example comprises a p-channel field-effect transistor (PFET) device, p-channel metal-oxide semiconductor field-effect transistor (MOSFET), or similar type of transistor. However, it should be understood that various other switching or gating circuitry can be employed to selectively isolate and connect electrical node 344 from voltage domain 373 or other voltage domains.

Boost control circuit 341 includes logic and circuitry to receive indications of timing from predictive control logic 320, and based on these indications to selectively couple or decouple electrical node 344 from voltage domain 373 or other voltage domains. Boost control circuit 341 might comprise a driver circuit for switching element 345, among other circuitry. Boost control circuit 341 might receive the indications from predictive control logic 320 in a particular digital or analog format and interpret or convert this format into one suitable for controlling switching element 345 over link 346. Once commanded to couple electrical node 344 from voltage domain 373, boost control circuitry 341 can activate switching element 345 and allow charge associated with capacitors 342, in the form of $I_{BOOST}$ and $V_{BOOST}$, to be injected into voltage domain 373. After the injection completes, then boost control circuitry 341 can deactivate switching element 345.

Graph 410 illustrates example charge injection operations. Similar to that of FIG. 2, a change in current for a particular voltage domain can lead to a voltage droop due to lack of available charge for the voltage domain to change quickly among current draws. This current change is illustrated by plot 411 in which a current quickly changes from $I_{DOMAIN-T1}$ to $I_{DOMAIN-T1}$. This current change can be due to particular operations being presently handled by target cores 330 or a particular volume of operations being presently handled by target cores 330. Decoupling capacitance can help with voltage droops, but delays due to electrical distance and line inductance can still lead to voltage droops, such as $V_{DROOP}$ as seen for plot 412.

However, a prediction has been made for this voltage droop, and electrical charge queued into capacitors 342 is ready to be injected into voltage domain 373. Example boost voltages $V_{BOOST1}$, $V_{BOOST2}$, and $V_{BOOST3}$ can be seen in plots 414, 415, and 416. Each of plots 414, 415, and 416 indicates a different example prediction that might offset a lesser, equal, or greater amount of $V_{DROOP}$ seen in plot 412, establishing $V_{ACTUAL}$ in plot 413. In a first example offset, noted by plot 414, undershoot or underprediction of the offset is shown, which might make $V_{ACTUAL}$ fall slightly below $V_{CORE}$. In a second example offset, noted by plot 415, a well predicted offset of $V_{DROOP}$ is shown, which results in a steady $V_{ACTUAL}$. In a third example offset, noted by plot 416, overshoot or overprediction of the offset is shown, which might make $V_{ACTUAL}$ rise slightly above $V_{CORE}$. However, as long as $V_{ACTUAL}$ does not exceed upper bounds for operating voltages of $V_{CORE}$, then overshoot in offset is still helpful in offsetting the voltage droop. $V_{ACTUAL}$ can thus vary based in part on how accurate of a prediction was made with regard to timing or magnitude of $V_{BOOST}$. In practice, a perfect offset of $V_{DROOP}$ with $V_{BOOST}$ might not be achieved, due to difficulties in predicting exact charge injection needs, as well as the variability in the workload for various target cores. This at least partial offset (which may have undershoot or overshoot) leads to a much more stable voltage level and operating voltage for target cores 330. $V_{ACTUAL}$ therefore typically corresponds to a steadier or less transient voltage presented to the voltage domain due to the predictive injection of charge into the voltage domain.

Figure 5:
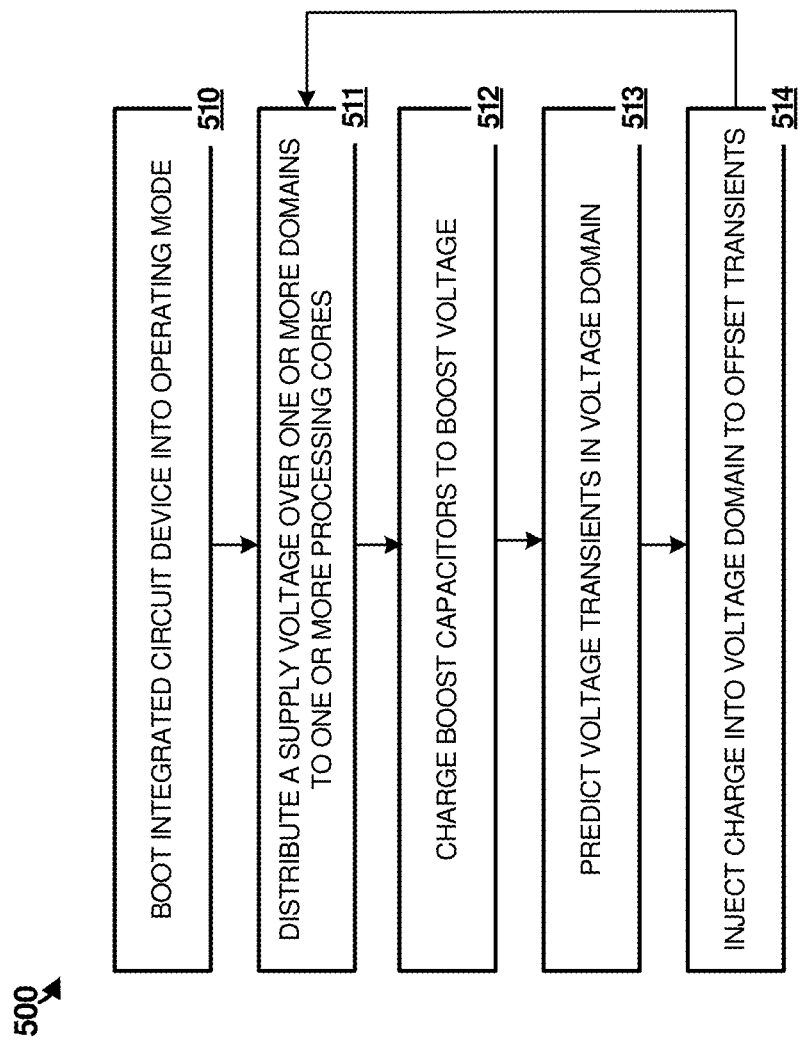
FIG. 5 illustrates example operations of a control system in an implementation.

FIG. 5 is provided to illustrate an example operation of a system which might employ a boost circuit with predictive logic as discussed herein. The operations of FIG. 5 are conducted in the context of FIGS. 3-4, although it should be understood that other elements might instead be employed.

In FIG. 5, an integrated circuit device boots (510) into an operating mode, such as into an operating system or other functional mode where operations, instructions, or commands are handled. This integrated circuit device might comprise one or more cores, such as processing cores or graphics cores indicated by target cores 330. These cores can be employed during execution of various operations according to installed operating systems, hypervisors, drivers, applications, games, or other software.

Prior to boot and during operation, a power supply circuit distributes (511) a supply voltage over one or more voltage domains to one or more cores of the integrated circuit device. Normal operations of the integrated circuit device can lead to transients on the voltage domains, such as intensive software processes which employ a large portion of the processing capability of one or more cores of the integrated circuit device, or lead to a rapid change in workload of the one or more cores. These rapid changes in workload can lead to voltage transients on the one or more voltage domains, and thus potential errors, faults, or disruptions to the operations of the cores.

Meanwhile, boost circuitry 340 charges (512) boost capacitors 342 to a boost voltage. This boost voltage can be a predetermined level, or a level which varies based on a present supply voltage level to the affected cores or voltage domain. Predictive control logic 320 predicts (513) voltage transients in the one or more voltage domains. Predictive control logic 320 can monitor pending operations or upcoming operations for the cores, which might be determined from command queues of the cores or processing elements, or from status of software/games being executed by the cores or processing elements of the integrated circuit device. Predictive control logic 320 then controls boost circuitry 340 to inject (514) charge into the one or more voltage domains to at least partially offset predicted voltage transients.

Figure 6:
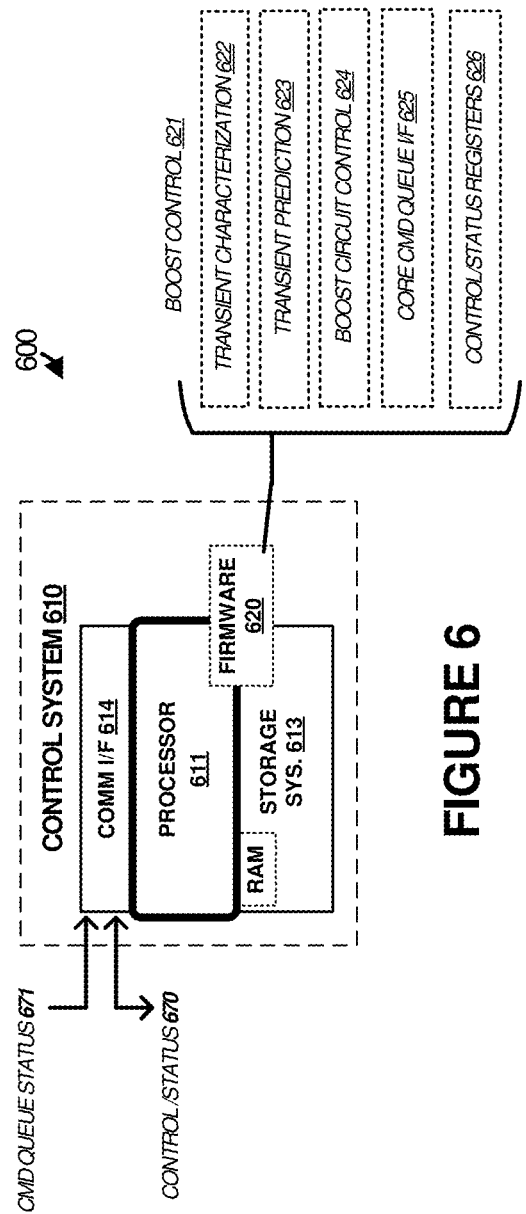
FIG. 6 illustrates an example control system in an implementation.

FIG. 6 illustrates control system 610 that is representative of any system or collection of systems from which the various boost control, predictive logic, or other power control operations can be directed. Any of the boost control, predictive logic, or other power control operations employed in the operational architectures, platforms, scenarios, and processes disclosed herein may be implemented using elements of control system 610. In one implementation, control system 610 is representative of at least a portion of boost circuitry 140 of FIG. 1, and predictive control logic 320 or boost circuitry 340 of FIG. 3.

Control system 610 may be implemented as a single apparatus, system, or device or may be implemented in a distributed manner as multiple apparatuses, systems, or devices. Control system 610 includes, but is not limited to, processor 611, storage system 613, communication interface system 614, and firmware 620. Processor 611 is operatively coupled with storage system 613 and communication interface system 614.

Processor 611 loads and executes firmware 620 from storage system 613. Firmware 620 includes boost control 621, which is representative of the processes discussed with respect to the preceding Figures. When executed by processor 611 to provide enhanced boost control, predictive logic, or other power control operations for target integrated circuit devices, firmware 620 directs processor 611 to operate as described herein for at least the various processes, operational scenarios, and sequences discussed in the foregoing implementations. Control system 610 may optionally include additional devices, features, or functionality not discussed for purposes of brevity.

Referring still to FIG. 6, processor 611 may comprise a microprocessor and processing circuitry that retrieves and executes firmware 620 from storage system 613. Processor 611 may be implemented within a single processing device, but may also be distributed across multiple processing devices, sub-systems, or specialized circuitry, that cooperate in executing program instructions and in performing the operations discussed herein. Examples of processor 611 include general purpose central processing units, application specific processors, and logic devices, as well as any other type of processing device, combinations, or variations thereof.

Storage system 613 may comprise any computer readable storage media readable by processor 611 and capable of storing firmware 620. Storage system 613 may include volatile and nonvolatile, removable and non-removable media implemented in any method or technology for storage of information, such as computer readable instructions, data structures, program modules, or other data. Examples of storage media include random access memory (RAM), read only memory, magnetic disks, optical disks, flash memory, virtual memory and non-virtual memory, magnetic cassettes, magnetic tape, magnetic disk storage or other magnetic storage devices, or any other suitable storage media. In no case is the computer readable storage media a propagated signal.

In addition to computer readable storage media, in some implementations storage system 613 may also include computer readable communication media over which at least some of firmware 620 may be communicated internally or externally. Storage system 613 may be implemented as a single storage device, but may also be implemented across multiple storage devices or sub-systems co-located or distributed relative to each other. Storage system 613 may comprise additional elements, such as a controller, capable of communicating with processor 611 or possibly other systems.

Firmware 620 may be implemented in program instructions and among other functions may, when executed by processor 611, direct processor 611 to operate as described with respect to the various operational scenarios, sequences, and processes illustrated herein. For example, firmware 620 may include program instructions for providing enhanced boost control, predictive logic, or other power control operations, among other operations.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Firmware 620 may include additional processes, programs, or components, such as operating system software or other application software, in addition to that of boost control 621. Firmware 620 may also comprise program code, scripts, macros, and other similar components. Firmware 620 may also comprise software or some other form of machine-readable processing instructions executable by processor 611.

In general, firmware 620 may, when loaded into processor 611 and executed, transform a suitable apparatus, system, or device (of which control system 610 is representative) overall from a general-purpose computing system into a special-purpose computing system customized to facilitate enhanced boost control, predictive logic, or other power control operations for target integrated circuit devices. Encoding firmware 620 on storage system 613 may transform the physical structure of storage system 613. The specific transformation of the physical structure may depend on various factors in different implementations of this description. Examples of such factors may include, but are not limited to, the technology used to implement the storage media of storage system 613 and whether the computer-storage media are characterized as primary or secondary storage, as well as other factors.

For example, if the computer readable storage media are implemented as semiconductor-based memory, firmware 620 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

Boost control 621 can include one or more software elements, such as an operating system, devices drivers, and one or more applications. These elements can describe various portions of control system 610 with which power control elements, voltage control elements, or other elements interact. For example, an operating system can provide a software platform on which boost control 621 is executed and allows for enhanced boost control, predictive logic, or other power control operations for target integrated circuit devices, among other operations.

In one example, transient characterization service 622 can monitor voltage levels of various power or voltage domains of an integrated circuit device. From these voltage levels, voltage transients can be detected. Transient characterization service 622 can correlate voltage transients to specific operations or commands being handled by cores of the integrated circuit device. For example, particular operations or commands might lead to a particular type of voltage transient having a magnitude and duration on one or more voltage domains. These voltage transients can comprise more than one voltage droop instance per transient event, such as seen in graph 210 of FIG. 2. Over time, particular commands or sets of commands can be determined to lead to particular voltage transients. Machine learning, artificial intelligence elements, or pattern detection algorithms might be employed by transient characterization service 622 to aid in detection and characterization of voltage transients and correlation to commands of the various cores.

Based on these characterizations, transient prediction service 623 can use live telemetry monitored for the operations pending for various cores of an integrated circuit devices to determine when voltage transients might occur. Transient prediction service 623 monitors pending operations for one or more cores, and based at least on the pending operations, predicts voltage transients on a voltage domain that distributes a supply voltage to the one or more cores. Transient prediction service 623 can determine timings of voltage boosts that inject electric charge into the voltage or power domain and offset at least the portions of the voltage transients in the voltage or power domain. The predictions correspond to estimations of increased current draw or increased workload estimations among the one or more cores based at least in part on monitoring upcoming operations in at least a command queue of the one or more cores. The voltage boosts establish at least partial timewise overlap between injections of the electric charge into the power domain and the voltage transients.

Boost circuit control 624 includes elements which control boost circuitry of a power control system. Boost circuit control 624 can indicate target or desired voltage boost levels to be provided to one or more voltage domains of a target integrated circuit device, such as by instructing boost circuitry to alter boost voltage levels which charges boost capacitance elements. Boost circuit control 624 can receive input from transient prediction service 623 which indicates timing on when to indicate to boost circuitry to switch boost charge in or out to a target voltage or power domain.

Core command queue interface 625 can provide an interface between command queues of cores of an integrated circuit device and elements of boost control 621. Core command queue interface 625 might receive indications of pending, upcoming, or present operations handled by one or more cores. These indications can be received over link 671, which might comprise one or more logical interfaces, physical interfaces, application programming interfaces, or software interfaces, among other interfaces.

Control/status registers 626 include one or more nonvolatile memory elements which provide status of the operation of control system 610 to external elements and system over link 670. Control over the operations of control/status registers 626 can also occur via modification or alteration of values stored within control/status registers 626, or of logic-coupled ones of control/status registers 626 which tie to operation of control system 610. Reads/writes of ones of control/status registers 626 can occur over link 670 from one or more external systems, which may include a target integrated circuit device. Various example control registers might include boost circuitry alteration and initiation control registers, boost circuitry status registers, manual setting of boost voltage levels or minimum/maximum voltage levels, as well as various identification information comprising serial numbers, model numbers, version numbers, and related information for both hardware and software elements.

Communication interface system 614 may include communication connections and devices that allow for communication over links 670 to communicate with a target integrated circuit device, as well as with control electronics, power control systems, voltage adjustment circuitry, voltage adjustment units, power regulator circuitry, power control circuitry, power supply circuitry, or with external systems (not shown in FIG. 6) over one or more communication networks (not shown). Examples of connections and devices that together allow for inter-system communication may include discrete control links, system management buses, serial control interfaces, register programming interfaces, network interface cards, antennas, power amplifiers, RF circuitry, transceivers, and other communication circuitry. The connections and devices may communicate over communication media to exchange packetized communications with other computing systems or networks of systems, such as metal, glass, air, or any other suitable communication media. Communication interface system 614 may include user interface elements, such as programming registers, control/status registers 626, APIs, or other user-facing control and status elements.

Communication between control system 610 and other circuitry and systems (not shown in FIG. 6), may occur over links 670-671 comprising one or more communication links or communication networks, and in accordance with various communication protocols, combinations of protocols, or variations thereof. These other systems can include target integrated circuit devices, power control systems, or manufacturing systems, among others. Communication interfaces might comprise system management bus (SMB) interfaces, inter-integrated circuit (I2C) interfaces, or other similar interfaces. Further examples include intranets, internets, the Internet, local area networks, wide area networks, wireless networks, wired networks, virtual networks, software defined networks, data center buses, computing backplanes, or any other type of network, combination of network, or variation thereof. Some example communication protocols that may be used include, but are not limited to, the Internet protocol (IP, IPv4, IPv6, etc.), the transmission control protocol (TCP), and the user datagram protocol (UDP), as well as any other suitable communication protocol, variation, or combination thereof.

Certain inventive aspects may be appreciated from the foregoing disclosure, of which the following are various examples.

Example 1

An assembly, comprising an integrated circuit device comprising one or more processing cores and a power domain configured to distribute a supply voltage to the one or more processing cores. The assembly also includes a charge injection circuit coupled to the power domain of the integrated circuit device, and configured to selectively couple electric charge into the power domain to predictively offset at least portions of voltage transients in the power domain.

Example 2

The assembly of Example 1, comprising the charge injection circuit having one or more capacitive elements charged to a boost voltage higher than the supply voltage, and at least a selector element configured to selectively couple the boost voltage to the power domain responsive to a control signal.

Example 3

The assembly of Examples 1-2, where the control signal indicates to the selector element timing for coupling the one or more capacitive elements to the power domain responsive to predictions of at least a portion of the voltage transients.

Example 4

The assembly of Examples 1-3, where the predictions correspond to estimations of increased current draw among the one or more processing cores based at least in part on monitoring upcoming operations in at least a command queue of the one or more processing cores.

Example 5

The assembly of Examples 1-4, the charge injection circuit further configured to establish at least partial timewise overlap between injections of the electric charge into the power domain and the voltage transients.

Example 6

The assembly of Examples 1-5, where establishing the at least partial timewise overlap comprises controlling the injections of the electric charge based at least in part on workload estimations among the one or more processing cores.

Example 7

The assembly of Examples 1-6, where the one or more processing cores comprise one or more among general purpose processing cores, graphics processing cores, digital signal processing (DSP) cores, application-specific integrated circuit (ASIC) cores, tensor processing cores, and artificial intelligence processing cores.

Example 8

The assembly of Examples 1-7, comprising a control unit configured to receive indications of at least pending commands within a command queue of the one or more processing cores, process the indications to predict one or more of the voltage transients in the power domain, and determine timings of voltage boosts that inject the electric charge into the power domain and offset at least the portions of the voltage transients in the power domain.

Example 9

The assembly of Examples 1-8, where the voltage boosts are provided in accordance with the timings and provided by selective coupling of one or more capacitive elements charged to a boost voltage higher than the supply voltage of the power domain.

Example 10

A method comprising monitoring pending operations for one or more processing cores of an integrated circuit device. Based at least on the pending operations, the method includes predicting voltage transients on a voltage domain that distributes a supply voltage to the one or more processing cores, and selectively injecting a boost voltage into the power domain to offset at least portions of the voltage transients in the power domain resultant from operation of the one or more processing cores.

Example 11

The method of Example 10, further comprising selectively injecting the boost voltage into the power domain by at least charging one or more capacitive elements to the boost voltage having a voltage level higher than the supply voltage, and selectively coupling the one or more capacitive elements to the power domain responsive to a control signal.

Example 12

The method of Examples 10-11, where the control signal indicates to a selector element when to couple the one or more capacitive elements to the power domain responsive to predictions of at least a portion of the voltage transients.

Example 13

The method of Examples 10-12, where the predictions correspond to estimations of increased current draw among the one or more processing cores based at least in part on monitoring the pending operations in at least a command queue of the one or more processing cores.

Example 14

The method of Examples 10-13, further comprising establishing at least partial timewise overlap between injections of the boost voltage into the power domain and the voltage transients.

Example 15

The method of Examples 10-14, where establishing the at least partial timewise overlap comprises controlling the injections of the voltage boost based at least in part on workload estimations among the one or more processing cores.

Example 16

The method of Examples 10-15, where the one or more processing cores comprise one or more among general purpose processing cores, graphics processing cores, digital signal processing (DSP) cores, application-specific integrated circuit (ASIC) cores, tensor processing cores, and artificial intelligence processing cores.

Example 17

The method of Examples 10-16, further comprising receiving indications of at least the pending operations within a command queue of the one or more processing cores, processing the indications to predict one or more of the voltage transients in the power domain, and determining timings of the voltage boosts to offset at least the portions of the voltage transients in the power domain.

Example 18

The method of Examples 10-17, where the voltage boosts are provided in accordance with the timings and provided by selective coupling of one or more capacitive elements charged to the boost voltage having a higher voltage level than the supply voltage of the power domain.

Example 19

A circuit, comprising one or more capacitive elements and a control system. The control system is configured to charge the one or more capacitive elements to a boost voltage higher than a supply voltage of a power domain that distributes the supply voltage to one or more processing cores of an integrated circuit device, and receive indications of at least pending operations within queues of the one or more processing cores. The control system is configured to process the pending operations to predict one or more voltage droops in the power domain of the integrated circuit device, and inject the boost voltage into the power domain to at least partially offset the one or more voltage droops.

Example 20

The circuit of Example 19, where predicting the one or more voltage droops corresponds to estimations of increased current draw among the one or more processing cores based at least in part on monitoring the pending operations, and the control system configured to establish at least partial timewise overlap between injections of the boost voltage into the power domain and the one or more voltage droops.

The functional block diagrams, operational scenarios and sequences, and flow diagrams provided in the Figures are representative of exemplary systems, environments, and methodologies for performing novel aspects of the disclosure. The descriptions and figures included herein depict specific implementations to teach those skilled in the art how to make and use the best option. For the purpose of teaching inventive principles, some conventional aspects have been simplified or omitted. Those skilled in the art will appreciate variations from these implementations that fall within the scope of the invention. Those skilled in the art will also appreciate that the features described above can be combined in various ways to form multiple implementations. As a result, the invention is not limited to the specific implementations described above, but only by the claims and their equivalents.

What is claimed is:

1. An assembly, comprising:
    an integrated circuit device comprising one or more processing cores and a power domain configured to distribute a supply voltage to the one or more processing cores; and
    a charge injection circuit coupled to the power domain of the integrated circuit device, and comprising one or more capacitive elements charged to a boost voltage higher than the supply voltage, wherein the charge injection circuit is configured to selectively couple stored electric charge into the power domain to predictively offset at least portions of voltage transients in the power domain.

2. The assembly of claim 1, comprising:
    at least a selector element configured to selectively couple the boost voltage to the power domain responsive to a control signal.

3. The assembly of claim 2, wherein the control signal indicates to the selector element timing for coupling the one or more capacitive elements to the power domain responsive to predictions of at least a portion of the voltage transients.

4. The assembly of claim 3, wherein the predictions correspond to estimations of increased current draw among the one or more processing cores based at least in part on monitoring upcoming operations in at least a command queue of the one or more processing cores.

5. The assembly of claim 1, the charge injection circuit further configured to:
    establish at least partial timewise overlap between injections of the electric charge into the power domain and the voltage transients.

6. The assembly of claim 5, wherein establishing the at least partial timewise overlap comprises controlling the injections of the electric charge based at least in part on workload estimations among the one or more processing cores.

7. The assembly of claim 1, wherein the one or more processing cores comprise one or more among general purpose processing cores, graphics processing cores, digital signal processing (DSP) cores, application-specific integrated circuit (ASIC) cores, tensor processing cores, and artificial intelligence processing cores.

8. The assembly of claim 1, comprising:
    a control unit configured to:
    receive indications of at least pending commands within a command queue of the one or more processing cores;
    process the indications to predict one or more of the voltage transients in the power domain; and
    determine timings of voltage boosts that inject the electric charge into the power domain and offset at least the portions of the voltage transients in the power domain.

9. The assembly of claim 8, wherein the voltage boosts are provided in accordance with the timings and provided by selective coupling of the one or more capacitive elements.

10. A method, comprising:
    monitoring pending operations for one or more processing cores of an integrated circuit device;
    charging one or more capacitive elements to a boost charge having a voltage level higher than a supply voltage for the one or more processing cores;
    based at least on the pending operations, predicting voltage transients on a voltage domain that distributes the supply voltage to the one or more processing cores; and
    selectively injecting the boost charge into the power domain to offset at least portions of the voltage transients in the power domain resultant from operation of the one or more processing cores.

11. The method of claim 10, further comprising:
    selectively coupling the one or more capacitive elements to the power domain responsive to a control signal.

12. The method of claim 11, wherein the control signal indicates to a selector element when to couple the one or more capacitive elements to the power domain responsive to predictions of at least a portion of the voltage transients.

13. The method of claim 12, wherein the predictions correspond to estimations of increased current draw among the one or more processing cores based at least in part on monitoring the pending operations in at least a command queue of the one or more processing cores.

14. The method of claim 10, further comprising:
establishing at least partial timewise overlap between injections of the boost charge into the power domain and the voltage transients.

15. The method of claim 14, wherein establishing the at least partial timewise overlap comprises controlling the injections of the boost charge based at least in part on workload estimations among the one or more processing cores.

16. The method of claim 10, wherein the one or more processing cores comprise one or more among general purpose processing cores, graphics processing cores, digital signal processing (DSP) cores, application-specific integrated circuit (ASIC) cores, tensor processing cores, and artificial intelligence processing cores.

17. The method of claim 10, further comprising:
receiving indications of at least the pending operations within a command queue of the one or more processing cores;
processing the indications to predict one or more of the voltage transients in the power domain; and
determining timings of voltage boosts using the boost charge to offset at least the portions of the voltage transients in the power domain.

18. The method of claim 17, wherein the voltage boosts are provided in accordance with the timings and provided by selective coupling of the one or more capacitive elements.

19. A circuit, comprising:
one or more capacitive elements; and
a control system configured to:
charge the one or more capacitive elements to a boost voltage higher than a supply voltage of a power domain that distributes the supply voltage to one or more processing cores of an integrated circuit device;
receive indications of at least pending operations within queues of the one or more processing cores;
process the pending operations to predict one or more voltage droops in the power domain of the integrated circuit device; and
inject the boost voltage into the power domain to at least partially offset the one or more voltage droops.

20. The circuit of claim 19, wherein predicting the one or more voltage droops corresponds to estimations of increased current draw among the one or more processing cores based at least in part on monitoring the pending operations; and the control system configured to:
establish at least partial timewise overlap between injections of the boost voltage into the power domain and the one or more voltage droops.

\* \* \* \* \*